United States Patent
Youn et al.

(10) Patent No.: US 12,198,943 B2
(45) Date of Patent: Jan. 14, 2025

(54) SUBSTRATE PROCESSING APPARATUS, PROCESS FLUID TREATING APPARATUS, AND OZONE DECOMPOSITION METHOD

(71) Applicant: SEMES CO., LTD., Chungcheongnam-do (KR)

(72) Inventors: Junhee Youn, Chungcheongnam-do (KR); Seung Hwan Cho, Ulsan (KR)

(73) Assignee: SEMES CO. LTD., Chungcheongnam-do (KR)

(*) Notice: Subject to any disclaimer, the term of this patent is extended or adjusted under 35 U.S.C. 154(b) by 956 days.

(21) Appl. No.: 17/133,104

(22) Filed: Dec. 23, 2020

(65) Prior Publication Data
US 2021/0114902 A1   Apr. 22, 2021

Related U.S. Application Data

(63) Continuation of application No. 15/791,975, filed on Oct. 24, 2017, now abandoned.

(30) Foreign Application Priority Data

Oct. 26, 2016   (KR) ........................ 10-2016-0140261

(51) Int. Cl.
   *H01L 21/67*   (2006.01)
   *B08B 3/08*    (2006.01)
   (Continued)

(52) U.S. Cl.
   CPC .......... *H01L 21/67017* (2013.01); *B08B 3/08* (2013.01); *C02F 1/58* (2013.01);
   (Continued)

(58) Field of Classification Search
   CPC ........ H01L 21/67017; C02F 1/78; C02F 1/58; C02F 1/727
   See application file for complete search history.

(56) References Cited

U.S. PATENT DOCUMENTS 7,617,836 B2   11/2009   Kim et al.
2009/0273103 A1*  11/2009   Watanabe ............. B01F 23/232
                                              261/28

FOREIGN PATENT DOCUMENTS

JP   H07124404 A   5/1995
JP   H08168671 A   7/1996
(Continued)

OTHER PUBLICATIONS

Machine translation of JP-2002346351-A, dated Dec. 3, 2002. (Year: 2002).*
Machine translation of JPH10328649A, dated Dec. 1998. (Year: 1998).*
(Continued)

*Primary Examiner* — Joseph L. Perrin
*Assistant Examiner* — Kevin G Lee
(74) *Attorney, Agent, or Firm* — Carter, DeLuca & Farrell LLP

(57) ABSTRACT

Disclosed are a substrate processing apparatus and a process fluid treating apparatus. The substrate processing apparatus includes a process chamber that processes a substrate with a process fluid including ozone, a discharge conduit connected to the process chamber to discharge the process fluid used to process the substrate, and a process fluid treating apparatus connected with the discharge conduit. The process fluid treating apparatus includes a housing having an inner space with a set volume in which the process fluid is received and an injection nozzle connecting the discharge conduit and the inner space of the housing.

16 Claims, 6 Drawing Sheets

(51) Int. Cl.
  *C02F 1/58* (2023.01)
  *C02F 1/72* (2023.01)
  *C02F 1/78* (2023.01)
  *B08B 3/14* (2006.01)
  *C02F 1/34* (2023.01)
  *C02F 101/10* (2006.01)
  *C02F 103/34* (2006.01)

(52) U.S. Cl.
  CPC ............... *C02F 1/727* (2013.01); *C02F 1/78* (2013.01); *B08B 3/14* (2013.01); *C02F 1/34* (2013.01); *C02F 2101/10* (2013.01); *C02F 2103/346* (2013.01); *C02F 2301/024* (2013.01); *C02F 2301/046* (2013.01); *C02F 2303/18* (2013.01); *H01L 21/67051* (2013.01)

(56) References Cited

FOREIGN PATENT DOCUMENTS

| | | | |
|---|---|---|---|
| JP | H08257547 A | | 10/1996 |
| JP | 10328649 A | * | 12/1998 |
| JP | H10328649 A | | 12/1998 |
| JP | 2001009206 A | | 1/2001 |
| JP | 2002346351 A | * | 12/2002 |
| JP | 2010-188315 A | | 9/2010 |
| KR | 20040035991 A | | 4/2004 |
| KR | 100555326 B1 | | 3/2006 |

OTHER PUBLICATIONS

Notice of Allowance received from the Chinese Patent Office in corresponding Chinese Patent Application No. 201711015273.3, dated Jul. 9, 2021, pp. 1-6, together with English translation.

* cited by examiner

SUBSTRATE PROCESSING APPARATUS, PROCESS FLUID TREATING APPARATUS, AND OZONE DECOMPOSITION METHOD

CROSS-REFERENCE TO RELATED APPLICATIONS

The present application is a continuation of U.S. patent application Ser. No. 15/791,975, filed Oct. 24, 2017, which claims the benefit and priority to Korean Patent Application No. 10-2016-0140261, filed Oct. 26, 2016, the entire contents of each of which are hereby incorporated by reference.

BACKGROUND

Embodiments of the inventive concept described herein relate to a substrate processing apparatus, a process fluid treating apparatus, and an ozone decomposition method.

A substrate is subjected to a variety of processes, such as photolithography, etching, ashing, ion implantation, thin-film deposition, cleaning, and the like, to manufacture a semiconductor device or a liquid crystal display. Among these processes, an etching process is used to remove unnecessary regions from a thin film formed on the substrate, and a high etching selectivity and a high etch rate are required for the thin film.

In an etching or cleaning process, a chemical treatment step, a rinsing step, and a drying step are generally performed on a substrate in a serial order. In the chemical treatment step, a chemical is supplied to the substrate to etch a thin film formed on the substrate or to remove foreign substances on the substrate, and in the rinsing step, a rinsing solution, such as DI water, is supplied to the substrate. Furthermore, fluid used to process the substrate may include ozone.

SUMMARY

Embodiments of the inventive concept provide a substrate processing apparatus, a process fluid treating apparatus, and an ozone decomposition method that effectively process a substrate.

According to an aspect of an embodiment, a substrate processing apparatus includes a process chamber that processes a substrate with a process fluid including ozone, a discharge conduit connected to the process chamber to discharge the process fluid used to process the substrate, and a process fluid treating apparatus connected with the discharge conduit. The process fluid treating apparatus includes a housing having an inner space with a set volume in which the process fluid is received and an injection nozzle that connects the discharge conduit and the inner space of the housing.

The injection nozzle may inject the process fluid downwards.

The injection nozzle may include a plurality of injection holes through which the process fluid is injected.

The injection nozzle may inject the process fluid by a spray method.

The process fluid treating apparatus may further include a strike plate located inside the housing such that a top side of the strike plate faces the process fluid injected through the injection nozzle.

The process fluid treating apparatus may further include a gas supply conduit that supplies gas including oxygen into the inner space of the housing.

The process fluid treating apparatus may further include a circulation line that has opposite ends connected to the housing and allows the process fluid discharged from the housing to flow into the housing again.

The process fluid treating apparatus may further include a gas supply conduit that supplies gas including oxygen into the inner space of the housing.

The process fluid treating apparatus may further include a strike plate located inside the housing such that a top side of the strike plate faces the process fluid injected through the injection nozzle, and the gas supply conduit may include an upper injection part that extends toward the inner space of the housing and injects the gas into a space between the injection nozzle and the strike plate.

The gas supply conduit may include a lower injection part that extends toward the inner space of the housing and injects the gas into the process fluid received in the inner space of the housing.

The process fluid treating apparatus may further include a circulation line that has opposite ends connected to the housing and allows the process fluid discharged from the housing to flow into the housing again.

The circulation line may have a turbulence creating part therein to allow the process fluid flowing through the circulation line to become turbulent.

The turbulence creating part may have a plate shape with one or more flow holes.

The flow holes may be formed to be inclined with respect to an axial direction of the circulation line.

The turbulence creating part may include a first plate and a second plate that block a part of a flow passage inside the circulation line and are located to have different slopes with respect to an axial direction of the circulation line.

A pump may be located on the circulation line.

A heater may be located on the circulation line.

A circulation nozzle may be located at one end of the circulation line through which the process fluid flowing through the circulation line flows into the housing again.

The circulation nozzle may inject the process fluid downwards.

The process fluid treating apparatus may further include a strike plate located inside the housing such that a top side of the strike plate faces the process fluid injected through the injection nozzle.

The process fluid treating apparatus may further include a gas supply conduit that supplies gas including oxygen into the inner space of the housing.

According to another aspect of an embodiment, a process fluid treating apparatus includes a housing having an inner space with a set volume in which a process fluid including ozone is received, a discharge conduit connected to the housing to supply the process fluid into the inner space of the housing, and a strike plate located in a moving path of the process fluid introduced by the discharge conduit.

The process fluid treating apparatus may further include an injection nozzle located on an end portion of the discharge conduit to inject the process fluid into the inner space of the housing.

According to another aspect of an embodiment, a process fluid treating apparatus includes a housing having an inner space with a set volume in which a process fluid including ozone is received, a discharge conduit connected to the housing to supply the process fluid into the inner space of the housing, and a circulation line that has opposite ends connected to the housing and allows the process fluid discharged from the housing to flow into the housing again.

The circulation line may have a turbulence creating part therein to allow the process fluid flowing through the circulation line to become turbulent.

A pump may be located on the circulation line.

A heater may be located on the circulation line.

A circulation nozzle that injects the process fluid downwards may be located at one end of the circulation line through which the process fluid flowing through the circulation line flows into the housing again.

According to another aspect of an embodiment, a method of decomposing ozone included in a process fluid includes recovering the process fluid, which includes the ozone and has been used to process a substrate, into an inner space of a housing, in which case the process fluid is injected into the inner space of the housing by a spray method.

The process fluid may be injected toward a strike plate disposed in the inner space of the housing.

The method may further include circulating the process fluid injected into the housing through a circulation line and decomposing the ozone by using a force applied to the process fluid in the circulation process.

The process fluid may flow through the circulation line while creating turbulence.

The process fluid may be heated while flowing through the circulation line.

Gas including oxygen may be supplied into the inner space of the housing.

The gas may be supplied to a part into which the process fluid is injected.

The gas may be supplied into the process fluid that is received in the housing after injected.

According to embodiments of the inventive concept, it is possible to provide a substrate processing apparatus, a process fluid treating apparatus, and an ozone decomposition method that are capable of effectively processing a substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
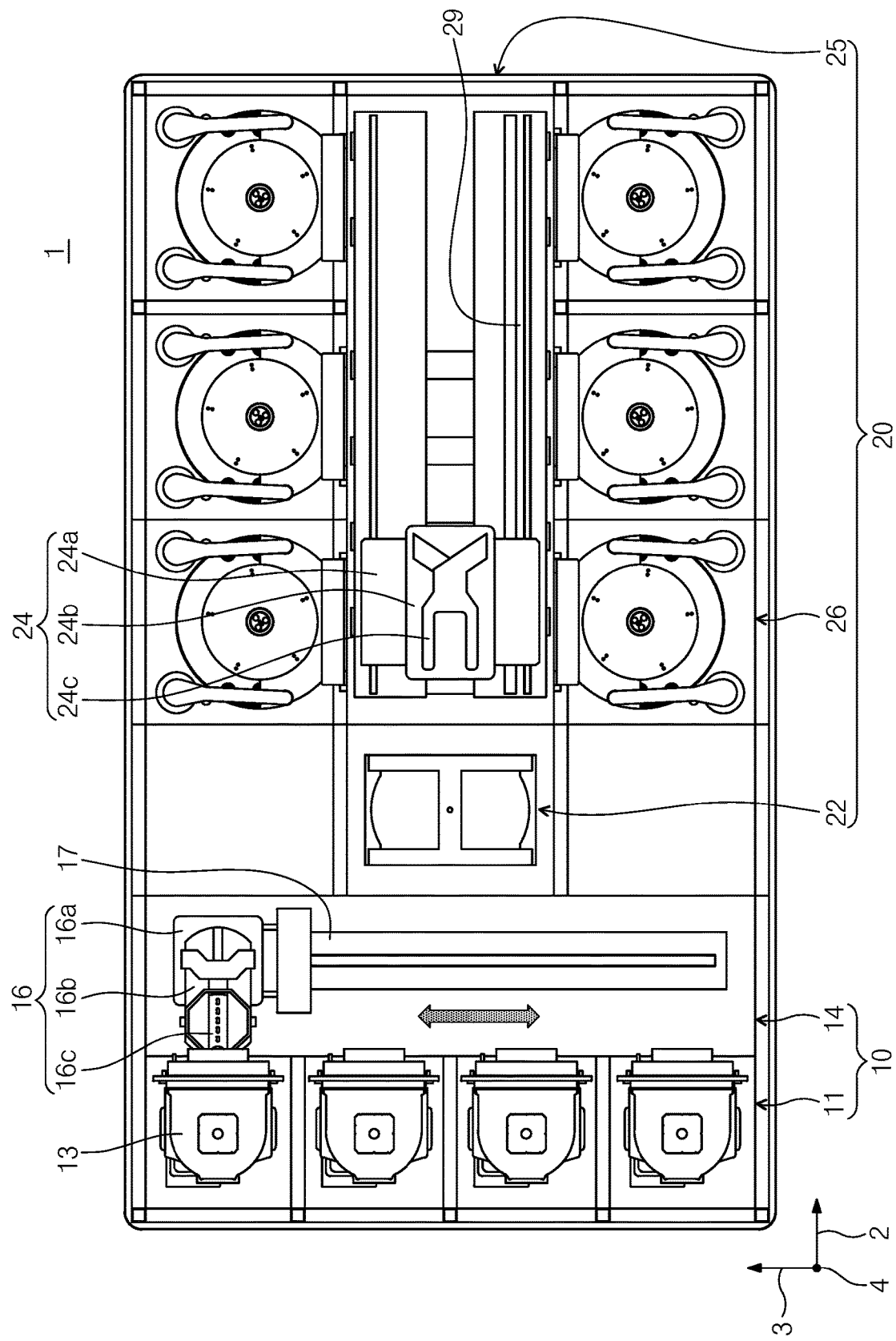
FIG. 1 is a plan view of a substrate processing apparatus according to an embodiment of the inventive concept.

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. In the drawings, the dimensions of elements are exaggerated for clarity of illustration.

FIG. 1 is a plan view of a substrate processing apparatus according to an embodiment of the inventive concept.

Referring to FIG. 1, a substrate processing apparatus 1 includes an index module 10 and a process module 20. The index module 10 has a plurality of load ports 11 and a transfer frame 14. The load ports 11, the transfer frame 14, and the process module 20 are sequentially arranged in a row. Hereinafter, the direction in which the load ports 11, the transfer frame 14, and the process module 20 are arranged is referred to as a first direction 2. When viewed from above, a direction perpendicular to the first direction 2 is referred to as a second direction 3, and a direction perpendicular to a plane that includes the first direction 2 and the second direction 3 is referred to as a third direction 4.

Carriers 13 having substrates W received therein are seated on the load ports 11, respectively. The plurality of load ports 11 are arranged in a row in the second direction 3. Four load ports 11 are illustrated in FIG. 1. However, the number of load ports 11 may increase or decrease depending on conditions, such as process efficiency and footprint of the process module 20. Each carrier 13 has a plurality of slots (not illustrated) formed therein to support edges of the substrates W. The plurality of slots are arranged in the third direction 4, and the substrates W are located in the carrier 13 so as to be stacked one above another in the third direction 4 with a spacing gap therebetween. A front opening unified pod (FOUP) may be used as the carrier 13.

The process module 20 has a buffer unit 22, a transfer chamber 25, and process chambers 26. The transfer chamber 25 is arranged such that the longitudinal direction thereof is parallel to the first direction 2. The process chambers 26 are disposed on opposite sides of the transfer chamber 25 in the second direction 3. The process chambers 26 on one side of the transfer chamber 25 and the process chambers 26 on the opposite side of the transfer chamber 25 are located in a symmetric arrangement with respect to the transfer chamber 25. Some of the process chambers 26 are arranged in the longitudinal direction of the transfer chamber 25. Furthermore, the other process chambers 26 are stacked one above another. That is, the process chambers 26 may be arranged in an A×B array (A and B being natural numbers of 1 or larger) on the opposite sides of the transfer chamber 25. Here, A is the number of rows in which the process chambers 26 are arranged in the first direction 2, and B is the number of columns in which the process chambers 26 are arranged in the third direction 4. In the case where four or six process chambers 26 are disposed on the opposite sides of the transfer chamber 25, the process chambers 26 may be arranged in a 2×2 or 3×2 array. The number of process chambers 26 may increase or decrease. Alternatively, the process chambers 26 may be disposed on only one side of the transfer chamber 25. In another case, the process chambers 26 may be disposed in a single layer on the opposite sides of the transfer chamber 25.

The buffer unit 22 is disposed between the transfer frame 14 and the transfer chamber 25. The buffer unit 22 has a space in which substrates W stay before transferred between the transfer chamber 25 and the transfer frame 14. The buffer unit 22 has a plurality of slots (not illustrated) therein, on which substrates W are placed. The plurality of slots (not illustrated) are separated from one another in the third direction 4. The buffer unit 22 is open at one side facing the transfer frame 14 and at an opposite side facing the transfer chamber 25.

The transfer frame 14 transfers substrates W between the carriers 13 seated on the load ports 11 and the buffer unit 22. The transfer frame 14 includes an index rail 17 and an index robot 16. The index rail 17 is arranged such that the longitudinal direction thereof is parallel to the second direction 3. The index robot 16 is installed on the index rail 17 and linearly moves along the index rail 17 in the second direction 3. The index robot 16 has a base 16a, a body 16b, and a plurality of index arms 16c. The base 16a is installed so as to be movable along the index rail 17. The body 16b is coupled to the base 16a. The body 16b may be configured to move on the base 16a in the third direction 4. Furthermore, the body 16b may be configured to rotate on the base 16a. The plurality of index arms 16c are coupled to the body 16b to move forward and rearward relative to the body 16b. The plurality of index arms 16c may operate individually. The index arms 16c are stacked one above another in the third direction 4 with a spacing gap therebetween. Some of the index arms 16c may be used to transfer substrates W from the process module 20 to the carriers 13, and the other index arms 16c may be used to transfer substrates W from the carriers 13 to the process module 20. Accordingly, it is possible to prevent particles generated from substrates W to be processed from adhering to processed substrates W in the process in which the index robot 16 carries the substrates W into and out of the process module 20.

The transfer chamber 25 transfers substrates W between the buffer unit 22 and the process chambers 26 and between the process chambers 26. The transfer frame 25 includes a guide rail 29 and a main robot 24. The guide rail 29 is arranged such that the longitudinal direction thereof is parallel to the first direction 2. The main robot 24 is installed on the guide rail 29 and linearly moves along the guide rail 29 in the first direction 2. The main robot 24 has a base 24a, a body 24b, and a plurality of main arms 24c. The base 24a is installed so as to be movable along the guide rail 29. The body 24b is coupled to the base 24a. The body 24b may be configured to move on the base 24a in the third direction 4. Furthermore, the body 24b may be configured to rotate on the base 24a. The plurality of main arms 24c are coupled to the body 24b to move forward and rearward relative to the body 24b. The plurality of main arms 24c may operate individually. The main arms 24c are stacked one above another in the third direction 4 with a spacing gap therebetween. The main arm 24c used to transfer substrates W from the buffer unit 22 to the process chambers 26 may differ from the main arm 24c used to transfer substrates W from the process chambers 26 to the buffer unit 22.

The process chambers 26 have substrate processing apparatuses 30 therein, respectively, to perform a cleaning process on a substrate W. The substrate processing apparatuses 30 (see FIG. 2) in the respective process chambers 26 may have different structures according to the types of cleaning processes to be performed. Alternatively, the substrate processing apparatuses 30 in the respective process chambers 26 may have the same structure. In another case, the process chambers 26 may be distinguished into a plurality groups; and the substrate processing apparatuses 30 in the process chambers 26 belonging to the same group may have the same structure, and the substrate processing apparatuses 30 in the process chambers 26 belonging to different groups may have different structures. For example, in the case where the process chambers 26 are distinguished into two groups, a first group of process chambers 26 may be disposed on one side of the transfer chamber 25, and a second group of process chambers 26 may be disposed on the opposite side of the transfer chamber 25. Alternatively, on the opposite sides of the transfer chamber 25, the first group of process chambers 26 may be disposed in a lower layer, and the second group of process chambers 26 may be disposed in an upper layer. The first group of process chambers 26 may be distinguished from the second group of process chambers 26 according to the types of chemicals to be used and the types of cleaning methods.

Figure 2:
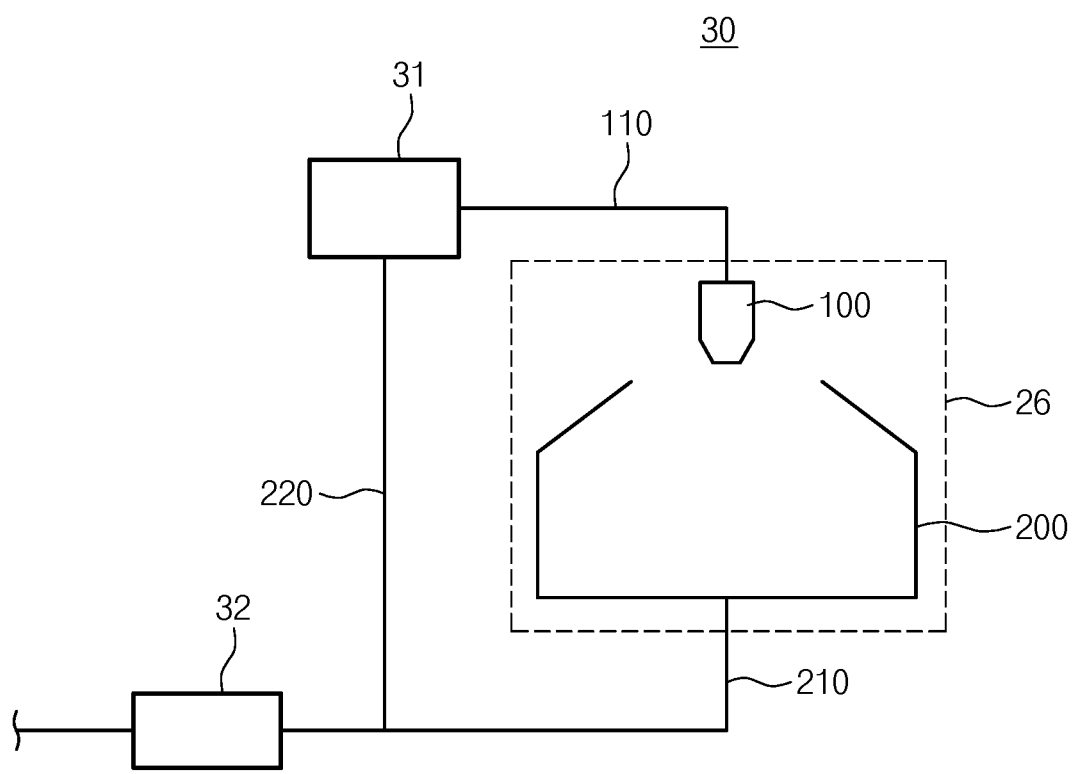
FIG. 2 illustrates a connection relation between elements for supplying a process fluid to a process chamber and recovering the same from the process chamber.

FIG. 2 illustrates a connection relation between elements for supplying a process fluid to a process chamber and recovering the same from the process chamber.

Referring to FIG. 2, the process chamber 26 is connected with a process fluid supply 31 and a process fluid treating apparatus 32. A process fluid may be ozone water or a mixture of ozone water and a liquid chemical.

The process chamber 26 has a nozzle 100 and a cup 200 inside. The process fluid supply 31 supplies the process fluid to the nozzle 100 through a supply conduit 110. While FIG. 2 illustrates that the process fluid supply 31 is connected with the single process chamber 26, the process fluid supply 31 may be connected with two or more process chambers 26. The process fluid supplied to a substrate through the nozzle 100 to perform a process is recovered by the cup 200 and then discharged through a discharge conduit 210 connected to the cup 200. A recovery conduit 220 may be connected to the discharge conduit 210 and the process fluid supply 31 to supply the process fluid recovered through the cup 200 to the process fluid supply 31.

Figure 3:
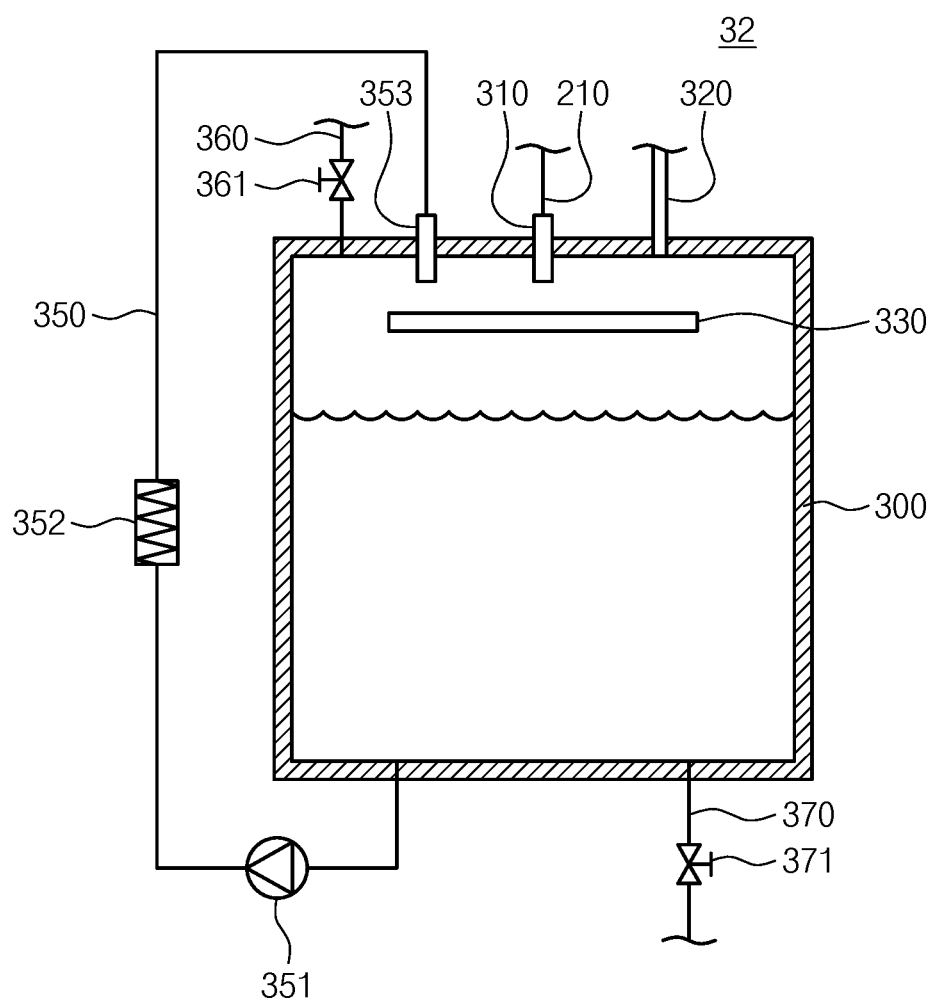
FIG. 3 illustrates a process fluid treating apparatus.
Figure 4:
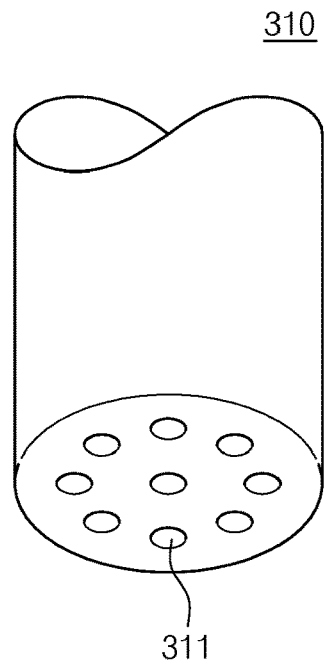
FIG. 4 illustrates an injection nozzle.

FIG. 3 illustrates a process fluid treating apparatus, and FIG. 4 illustrates an injection nozzle.

The process fluid treating apparatus 32 is connected to the discharge conduit 210 to remove ozone included in a process fluid or to reduce the amount of ozone included in the process fluid.

Referring to FIG. 3, the process fluid treating apparatus 32 includes a housing 300, an injection nozzle 310, a gas supply conduit 320, a strike plate 330, and a circulation line 350.

The housing 300 has a space in which to receive the process fluid introduced through the discharge conduit 210. The housing 300 has an inner space formed therein to receive a set amount of process fluid.

The injection nozzle 310 connects the discharge conduit 210 and the inner space of the housing 300 to allow the process fluid introduced into the discharge conduit 210 to be supplied into the inner space of the housing 300. The injection nozzle 310 has a plurality of injection holes 311 formed therein, and the process fluid may be injected through the injection holes 311 in the form of a plurality of streams or in a mist form by a spray method. Accordingly, it is possible to increase a contact area between the process fluid and gas in the inner space of the housing 300, thereby enhancing the degree of decomposition of ozone included in the process fluid.

The gas supply conduit 320 supplies, into the inner space of the housing 300, a decomposition gas that reacts with ozone included in the process fluid to facilitate decomposition of the ozone. The decomposition gas includes oxygen. For example, the decomposition gas may be air.

The strike plate 330 is disposed in the inner space of the housing 300. The strike plate 330 is located such that one side thereof faces the process fluid injected through the injection nozzle 310. For example, the injection nozzle 310 may be located on the top side or a lateral side of the housing 300 to inject the process fluid downwards. A part of a lateral side of the strike plate 330 may be secured to an inside of the housing 300, and the top side of the strike plate 330 may be located in the path along which the process fluid injected through the injection nozzle 310 moves. Accordingly, the process fluid injected through the injection nozzle 310 collides with the strike plate 330, and the degree of decomposition of ozone is enhanced by forces applied to the process fluid during the collision and an effect, such as an increase in the area by which particles react with the gas while being broken in a scattering process after the collision.

Figure 5:
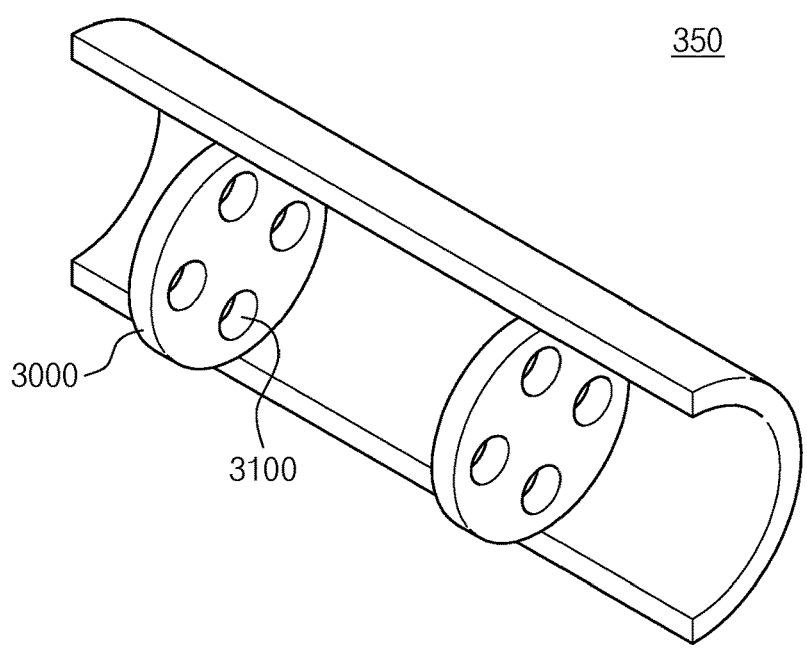
FIG. 5 is a partially sectioned view of a circulation line.
Figure 6:
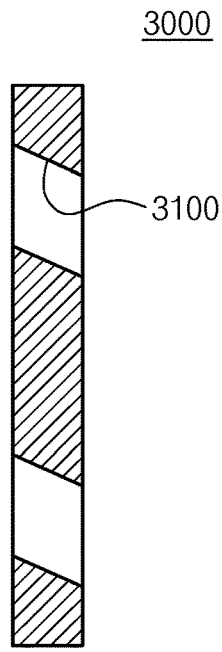
FIG. 6 is a longitudinal sectional view of a turbulence creating part.

FIG. 5 is a partially sectioned view of a circulation line, and FIG. 6 is a longitudinal sectional view of a turbulence creating part.

The circulation line 350 provides a path along which the process fluid received in the housing 300 circulates. One end of the circulation line 350 is connected to the bottom of the housing 300, and the process fluid received in the housing 300 flows into the circulation line 350. An opposite end of the circulation line 350 is connected to the top of the housing 300, and the process fluid in the circulation line 350 flows into the housing 300 again. The circulation line 350 has one or more turbulence creating parts 3000 therein. The turbulence creating parts 3000 have a plate shape having one or more flow holes 3100 formed therein. Accordingly, the circulating fluid becomes turbulent while colliding with the turbulence creating parts 3000 and flowing through the flow holes 3100, and forces caused by the turbulent flow facilitate decomposition of ozone. The flow holes 3100 formed in the turbulence creating parts 3000 may be inclined with respect to the axial direction of the circulation line 350. Accordingly, the flow direction of the process fluid passing through the flow holes 3100 may be inclined with respect to the axial direction of the circulation line 350, and thus turbulence may be easily created. Furthermore, in the case where the turbulence creating part 3000 has the plurality of flow holes 3100 formed therein, the flow holes 3100 may be inclined in different directions to enhance the degree to which turbulence is created.

A pump 351 may be located on the circulation line 350. The pump 351 may be located adjacent to the one end of the circulation line 350 into which the process fluid flows. The pump 351 applies pressure to the process fluid to allow the process fluid to effectively flow while creating turbulence. Furthermore, the pressure applied by the pump 351 may facilitate decomposition of ozone included in the process fluid.

A heater 352 may be located on the circulation line 350. The heater 352 may heat the process fluid to facilitate the decomposition of ozone.

A circulation nozzle 353 is located at the opposite end of the circulation line 350. The circulation nozzle 353 has a plurality of holes formed therein, similarly to the injection nozzle 310 of FIG. 4. Accordingly, the process fluid flowing into the housing 300 again through the circulation line 350 may be injected in the form of a plurality of streams or in a mist form, and thus the degree of decomposition of ozone may be enhanced. The circulation nozzle 353 may be located on the top side or a lateral side of the housing 300 to inject the process fluid downwards toward the strike plate 330, thereby permitting the injected process fluid to collide with the strike plate 330.

If ozone included in the process fluid is decomposed as a setting time passes, a discharge valve 371 on a discharge line 370 connected to the bottom of the housing 300 is opened to discharge the process fluid from the housing 300. The gas inside the housing 300 may be discharged through a gas discharge line 360 by opening a gas discharge valve 361 on the gas discharge line 360. The discharge of the gas inside the housing 300 may be performed while ozone is being decomposed.

Figure 7:
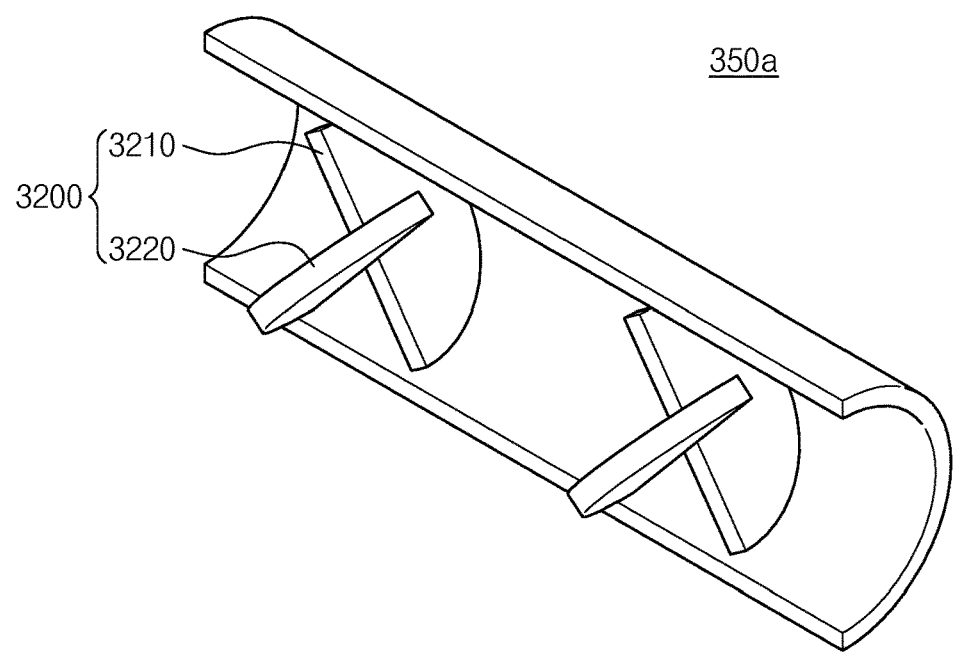
FIG. 7 is a partially sectioned view of a circulation line according to another embodiment.

FIG. 7 is a partially sectioned view of a circulation line according to another embodiment.

Referring to FIG. 7, turbulence creating parts 3200 may include a first plate 3210 and a second plate 3220. The first plate 3210 and the second plate 3220 may have a plate shape and may be located to block a part of a flow passage inside a circulation line 350a. The first plate 3210 and the second plate 3220 may be installed at different slopes with respect to the axial direction of the circulation line 350a. For example, the first plate 3210 and the second plate 3220 may be obliquely installed in different directions from the axial direction of the circulation line 350a, as illustrated in FIG. 7. In another example, one of the first plate 3210 and the second plate 3220 may be installed to be perpendicular to the axial direction of the circulation line 350a, and the other may be obliquely installed to be inclined with respect to the axial direction of the circulation line 350a. Accordingly, a process fluid may collide with the turbulence creating parts 3200 in a flow process and may flow through the space between the first plate 3210 and the second plate 3220 while creating turbulence, thereby facilitating decomposition of ozone included in the process fluid.

Figure 8:
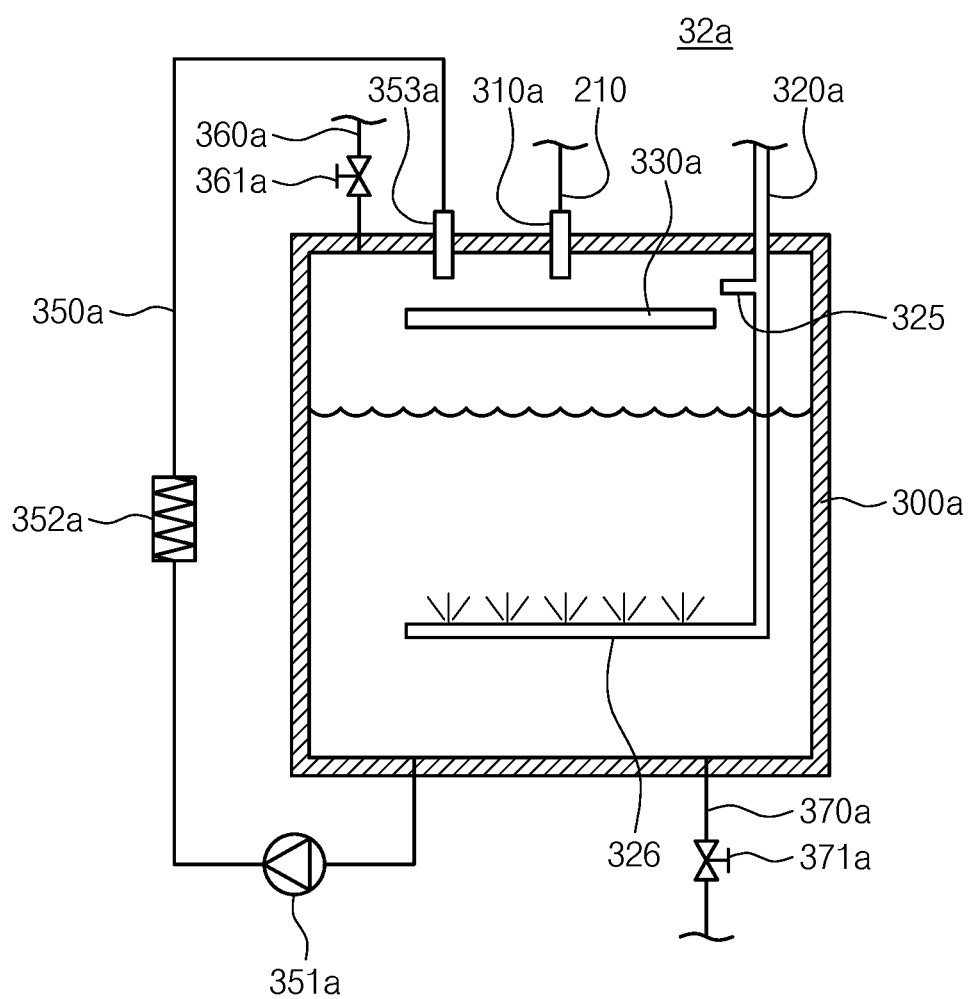
FIG. 8 illustrates a process fluid treating apparatus according to another embodiment.

FIG. 8 illustrates a process fluid treating apparatus according to another embodiment.

Referring to FIG. 8, a process fluid treating apparatus 32a includes a housing 300a, an injection nozzle 310a, a gas supply conduit 320a, a strike plate 330a, and a circulation line 350a.

Since the housing 300a, the injection nozzle 310a, the strike plate 330a, the circulation line 350a, a discharge line 370a, a gas discharge line 360a, and a pump 351a, a heater 352a, and a circulation nozzle 353a located along the circulation line 350a are the same as those of the process fluid treating apparatus 32 of FIG. 3, repetitive descriptions thereof will be omitted.

The gas supply conduit 320a extends toward an inner space of the housing 300a. The gas supply conduit 320a includes an upper injection part 325. The upper injection part 325 is configured to inject a decomposition gas into the space between the injection nozzle 310a and the strike plate 330a. Accordingly, a process fluid injected through the injection nozzle 310a and a process fluid injected through the circulation nozzle 353a may make frequent contact with the decomposition gas before and after a collision with the strike plate 330a, and thus the degree of decomposition of ozone may be enhanced.

The gas supply conduit 320a further includes a lower injection part 326. The lower injection part 326 is located in a lower inner space of the housing 300a to inject a decomposition gas into a process fluid received in the housing 300a. The lower injection part 326 may be inclined with respect to the vertical direction. For example, the lower injection part 326 may horizontally extend and may be configured to spray a decomposition gas from one or more locations thereof in the longitudinal direction, thereby increasing contact between the decomposition gas and the process fluid.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate processing apparatus comprising:
   a process chamber configured to process a substrate with a process fluid containing ozone;
   a discharge conduit configured to discharge the process fluid used to process the substrate from the process chamber; and
   a process fluid treating apparatus connected to the discharge conduit,
   wherein the process fluid treating apparatus includes:
      a housing configured to form an inner space in which the process fluid is received;
      an injection nozzle configured to supply, into the inner space, the process fluid introduced into the discharge conduit; and
      a strike plate located inside the housing such that an upper surface of the strike plate faces the process fluid injected through the injection nozzle; and
      a gas supply conduit configured to supply a decomposition gas into the inner space for reacting with the ozone of the process fluid,
      wherein the strike plate is disposed so as not to be immersed in the process fluid received in the inner space.

2. The substrate processing apparatus of claim 1, wherein the strike plate is implemented with a blocking plate having no hole formed therein.

3. The substrate processing apparatus of claim 1, wherein the gas supply conduit injects the decomposition gas into the inner space.

4. The substrate processing apparatus of claim 3, wherein the gas supply conduit includes a lower injection part configured to inject the decomposition gas in a state of being immersed in the process fluid received in the inner space.

5. The substrate processing apparatus of claim 4, wherein the lower injection part extends in a left/right direction and injects the decomposition gas from one or more locations thereof in a longitudinal direction.

6. The substrate processing apparatus of claim 1, wherein the process fluid treating apparatus further includes a circulation line configured to provide a path along which the process fluid received in the inner space circulates.

7. The substrate processing apparatus of claim 6, wherein one end of the circulation line is connected with a lower portion of the housing,
   wherein an opposite end of the circulation line is connected to an upper portion of the housing, and
   wherein a circulation nozzle having a plurality of holes formed therein is located at the opposite end of the circulation line.

8. The substrate processing apparatus of claim 6, wherein at least one turbulence creating part is located inside the circulation line.

9. The substrate processing apparatus of claim 8, wherein the turbulence creating part has the shape of a plate having one or more flow holes formed therein.

10. The substrate processing apparatus of claim 9, wherein the flow holes are formed to be inclined with respect to an axial direction of the circulation line.

11. The substrate processing apparatus of claim 8, wherein the turbulence creating part includes:
    a first plate; and
    a second plate, and
    wherein the first plate and the second plate are installed at different slopes with respect to an axial direction of the circulation line and are located to block part of a flow passage inside the circulation line.

12. A process fluid treating apparatus comprising:
    a housing having an inner space with a set volume in which a process fluid containing ozone is received;
    an injection nozzle configured to supply, into the inner space, the process fluid used to process a substrate;
    a gas supply conduit configured to supply a decomposition gas into the inner space for reacting with the ozone of the process fluid; and
    a strike plate located inside the housing such that an upper surface of the strike plate faces the process fluid injected through the injection nozzle, wherein the strike plate is disposed so as not to be immersed in the process fluid received in the inner space.

13. The process fluid treating apparatus of claim 12, wherein the strike plate is implemented with a blocking plate having no hole formed therein.

14. The process fluid treating apparatus of claim 12, wherein the gas supply conduit injects the decomposition gas into the inner space.

15. The process fluid treating apparatus of claim 14, wherein the gas supply conduit includes a lower injection part configured to inject the decomposition gas in a state of being immersed in the process fluid received in the inner space.

16. The process fluid treating apparatus of claim 15, wherein the lower injection part extends in a left/right direction and injects the decomposition gas from one or more locations thereof in a longitudinal direction.

* * * * *